(12) United States Patent
Nguyen

(10) Patent No.: US 9,545,033 B2
(45) Date of Patent: Jan. 10, 2017

(54) COMMUNICATION MODULE ASSEMBLY WITH HEAT SINK AND METHODS OF MANUFACTURE

(71) Applicant: FINISAR CORPORATION, Sunnyvale, CA (US)

(72) Inventor: Long Van Nguyen, San Jose, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 22 days.

(21) Appl. No.: 14/733,894

(22) Filed: Jun. 8, 2015

(65) Prior Publication Data

US 2015/0282382 A1 Oct. 1, 2015

Related U.S. Application Data

(63) Continuation of application No. 13/629,260, filed on Sep. 27, 2012, now Pat. No. 9,052,483.

(60) Provisional application No. 61/539,685, filed on Sep. 27, 2011.

(51) Int. Cl.
*H05K 7/20* (2006.01)
*G02B 6/42* (2006.01)
*H04B 10/40* (2013.01)
*H05K 7/18* (2006.01)

(52) U.S. Cl.
CPC ........... *H05K 7/2039* (2013.01); *G02B 6/4246* (2013.01); *G02B 6/4261* (2013.01); *G02B 6/4269* (2013.01); *H04B 10/40* (2013.01); *H05K 7/183* (2013.01); *H05K 7/186* (2013.01); *H05K 7/20154* (2013.01); *H05K 7/20418* (2013.01); *Y10T 29/49826* (2015.01)

(58) Field of Classification Search
CPC ....................................... G02B 6/4268–6/4269
See application file for complete search history.

(56) References Cited

U.S. PATENT DOCUMENTS

| | | | | |
|---|---|---|---|---|
| 6,160,707 A | * | 12/2000 | Yin | H05K 7/1405 361/704 |
| 6,811,326 B2 | * | 11/2004 | Keeble | G02B 6/4201 385/92 |
| 7,003,230 B2 | * | 2/2006 | Branch | H05K 7/1428 361/704 |
| 7,133,287 B2 | * | 11/2006 | Campini | G06F 1/183 165/80.3 |
| 7,498,673 B2 | * | 3/2009 | Awad | H01L 23/3675 174/545 |
| 7,780,361 B2 | * | 8/2010 | Harris | G02B 6/4246 361/697 |

(Continued)

*Primary Examiner* — Robert J Hoffberg
(74) *Attorney, Agent, or Firm* — Maschoff Brennan

(57) ABSTRACT

A communication assembly can include: a module device; a cage having a body defining a first open end that is configured to receive the module device therethrough and the body defining one or more first receiver members between the first end and a second end opposite of the first end, the one or more first receiver members having a first part of fastening system (e.g., two-part fastening system); and a heat sink adapted to be received into the cage so as to be thermally coupled with the module device, the heat sink having a body defining one or more second receiver members configured to receive the one or more first receiver members, the one or more second receiver members having a second part of the fastening system that couples with the first part of the fastening system.

3 Claims, 8 Drawing Sheets

(56) References Cited

U.S. PATENT DOCUMENTS

| | | | | |
|---|---|---|---|---|
| 7,834,444 B2 * | 11/2010 | Awad | ................... | H01L 23/3675 |
| | | | | 174/545 |
| 8,057,110 B2 * | 11/2011 | Harris | ................... | G02B 6/4246 |
| | | | | 361/697 |
| 8,345,426 B2 * | 1/2013 | Nichols | ................ | H05K 7/1418 |
| | | | | 165/80.2 |
| 8,670,238 B2 * | 3/2014 | Wang | ................... | G02B 6/4261 |
| | | | | 165/185 |
| 9,052,483 B2 * | 6/2015 | Nguyen | ............... | G02B 6/4261 |

* cited by examiner

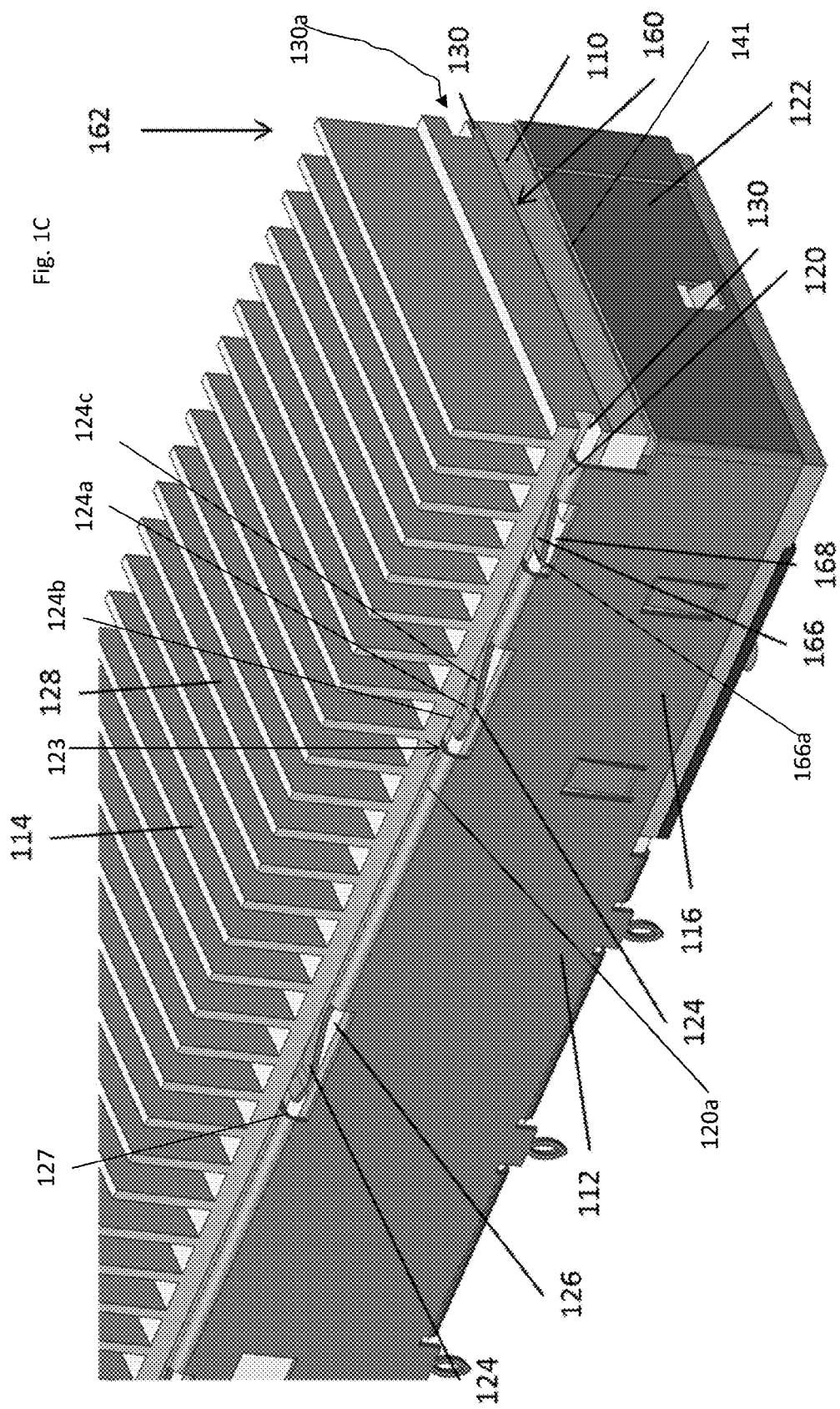

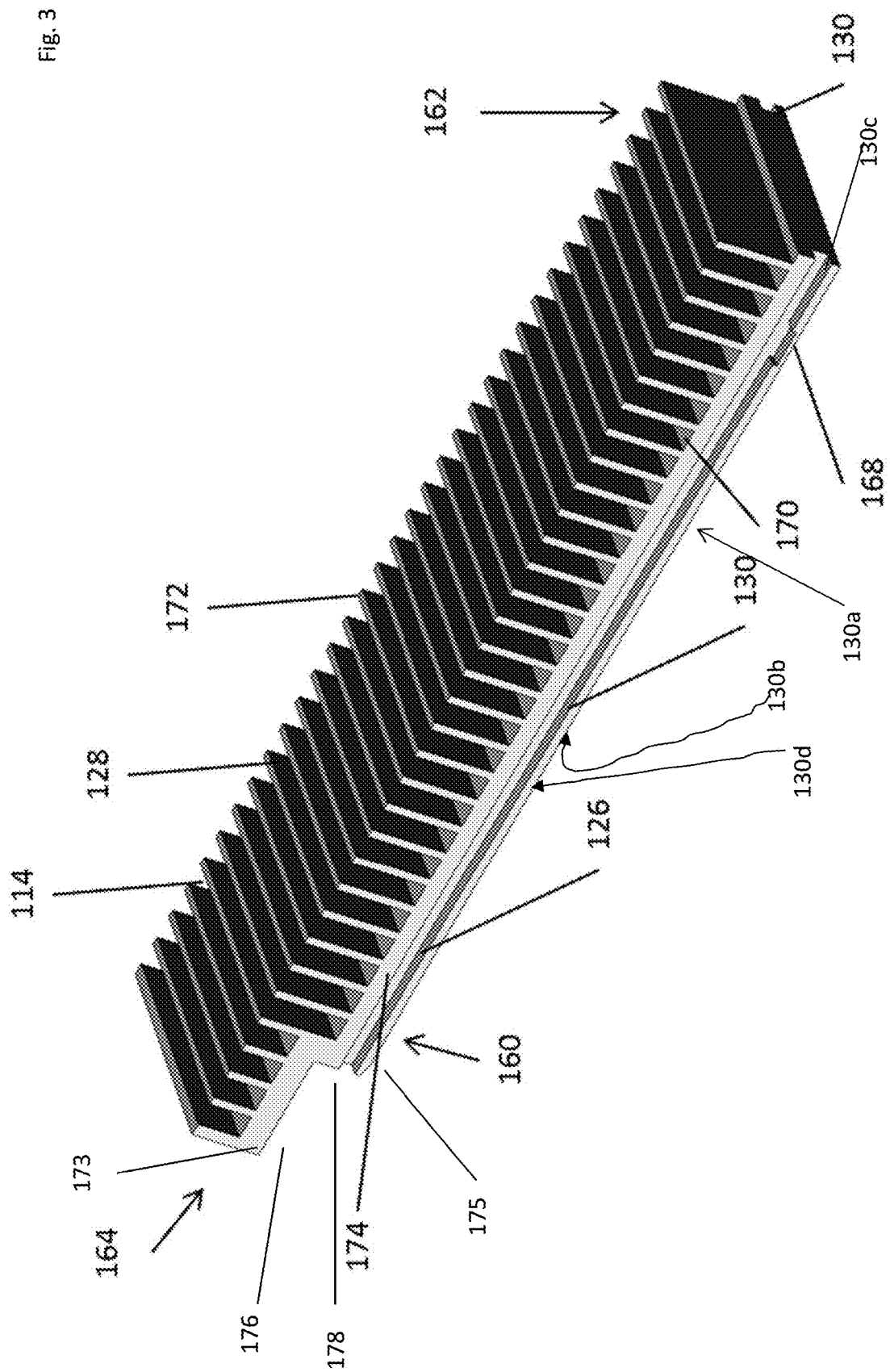

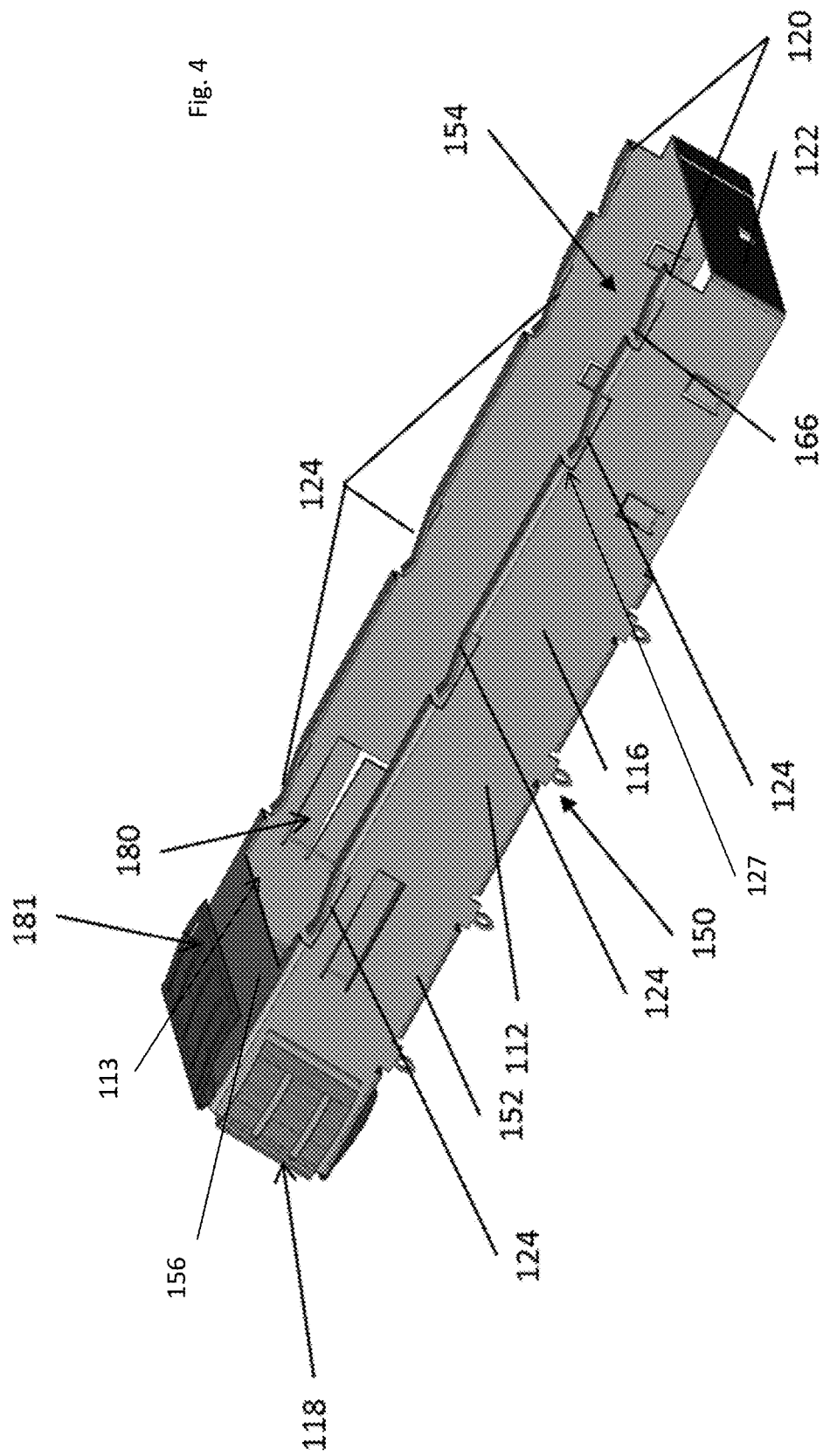

COMMUNICATION MODULE ASSEMBLY WITH HEAT SINK AND METHODS OF MANUFACTURE

CROSS-REFERENCE TO RELATED APPLICATIONS

This U.S. Patent Application is a continuation application of U.S. patent application Ser. No. 13/629,260, filed Sep. 27, 2012, which claims benefit of Provisional U.S. Patent Application No. 61/539,685, filed Sep. 27, 2011, both which are incorporated herein by specific reference in their entireties.

BACKGROUND

Electronic modules, such as electronic or optoelectronic transceiver or transponder modules, are increasingly used in electronic and optoelectronic communications. Some modules can be plugged into a variety of host networking equipment. Multi-Source Agreements ("MSAs"), such as the X2 MSA, the XENPAC MSA, the 10 Gb/s Small Form Factor Pluggable ("XFP") MSA, and the CFP MSA (e.g., CFP2/CFP4 MSA) specify, among other things, package dimensions for modules and/or power dissipation characteristics. Conformity with an MSA allows a module to be plugged into host equipment designed in compliance with the MSA. Modules typically communicate with a printed circuit board of a host device by transmitting electrical signals to the printed circuit board and receiving electrical signals from the printed circuit board. These electrical signals can then be transmitted by the module outside the host device as optical and/or electrical signals.

One common difficulty associated with modules concerns the generation of heat during the operation of the modules. The heat, if not dissipated, can cause a module to malfunction or to become damaged. This generated heat can cause damage to the optical subassembly, to the laser diode, and to photodiodes contained in the subassembly and cause degradation or other problems for the materials holding the various components together. For example, certain epoxies, solder, or other bonding materials can be degraded or otherwise negatively affected by significant heat generation in the optical subassembly.

Currently, many external heat sinks that are used for optical transceivers use traditional mounting methods either by a metal clip (e.g., in small form factor units such as SFP, QSFP, XFP) or mounting screw with a compression spring (e.g., in larger form factor units such as CFP). In a small form factor transceiver, the host cage typically has a top opening to allow an external heat sink to make contact with the module top surface. The coupling of the module with the heat sink is often by a top-down mounting method. Due to manufacturing constraints, the opening is typically relatively small, and thereby minimizing the surface contact area between the module and the heat sink. Information related to previous heat sink technologies useful in optical transceivers can be obtained in U.S. Pat. Nos. 7,308,206 and 7,859,849, and U.S. application Ser. No. 12/891,677 now issued as U.S. Pat. No. 8,164,922, which patents and applications are incorporated herein by specific reference in their entirety.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

In one embodiment, the present invention can include a communication device comprising the assembly of one of the embodiments described herein. The communication device can be configured as an optical communication device.

In one embodiment, a communication assembly or kit thereof can include: a module device; a cage having a body defining a first open end that is configured to receive the module device therethrough and the body defining one or more first receiver members between the first end and a second end opposite of the first end, the one or more first receiver members having a first part of fastening system (e.g., two-part fastening system); and a heat sink adapted to be received into the cage so as to be thermally coupled with the module device, the heat sink having a body defining one or more second receiver members configured to receive the one or more first receiver members, the one or more second receiver members having a second part of the fastening system that couples with the first part of the fastening system.

In one embodiment, a communication assembly or kit thereof can include: a module device; a cage having a body defining a first open end that is configured to receive the module device therethrough and the body defining one or more first segmented receiver members between the first open end and a second end opposite of the first end with gaps between each of the individual first segmented receiver members, at least one of the one or more first segmented receiver members having a first part (e.g., first fastener) of a fastening system; and a heat sink adapted to be received into the cage so as to be thermally coupled with the module device, the heat sink having a body defining one or more second segmented receiver members configured to receive the one or more first segmented receiver members, at least one of the one or more second segmented receiver members having a second part (e.g., second fastener) of the fastening system.

In one embodiment, an assembled communication assembly can include: a module device; a cage having a body defining a first open end having the module device received therethrough and the body defining one or more first receiver members in a first plane between the first end and a second end opposite of the first end on each side of the cage, at least one of the one or more first receiver members having a first part of a fastening system; and a heat sink received into the cage so as to be thermally coupled with the module device, the heat sink having a body defining one or more second receiver members mated with the one or more first receiver members on each side of the heat sink, at least one of the one or more second receiver members having a second part of the fastening system fastened with the first part of the fastening system.

In one embodiment, an assembled communication assembly can include: a module device having a middle portion, a thin end portion with a smaller cross-sectional profile, and a thick end portion with a larger cross-sectional profile; a cage having a body defining a first open end having the middle portion of the module device received therethrough with the thick end portion extending from the first open end of the cage and the body defining one or more lip-shaped (e.g., rail protrusions) first receiver members between the first open end and a second end opposite of the first end in a plane of the cage, at least one of the one or more lip-shaped first receiver members having a first part of a fastening system; and a heat sink received into the cage so as to be thermally coupled with the middle portion of the module device, the heat sink having a body defining one or more slot-shaped second receiver members in a plane of the heat sink located between a first end and second end of the heat sink and receiving the one or more lip-shaped first receiver members, at least one of the one or more slot-shaped second receiver members having a second part of the fastening system fastened with the first part of the fastening system received therewith, wherein one of the first or second part of the fastening system includes one or more springs and the other part includes one or more spring-receiving surfaces.

In one embodiment, an assembled communication assembly can include: a module device having a middle portion, a thin end portion with a small cross-sectional profile compared to the middle portion, and a thick end portion with a large cross-sectional profile compared to the middle portion, the middle portion having a module top surface and opposite module bottom surface and module side surfaces; a cage having a body defining a first open end having the middle portion of the module device received therethrough with the thick end portion extending from the cage, the cage body defining a cage bottom surface associated with the module bottom surface and defining cage side surfaces associated with the module side surface and defining one or more lip-shaped first receiver members in a plane of the cage between the first open end and a second end opposite and extending toward the first end and at the top opening of the cage, the one or more lip-shaped first receiver members defining a cage top opening and having a first part of a fastening system; and a heat sink received into the cage so as to be thermally coupled with the middle portion of the module device, the heat sink having a body defining a heat sink bottom surface that is engaged with the module top surface and the body defining one or more slot-shaped second receiver members in a plane of the heat sink adjacent to the heat sink bottom surface and extending from a heat sink first end toward a heat sink second end, the one or more slot-shaped second receiving members engaged with the one or more lip-shaped first receiver members, the one or more slot-shaped second receiver members having a second part of the fastening system fastened with the first part of the fastening system, wherein one of the first or second part of the fastening system includes one or more springs and one or more spring clips and the other part of the fastening system includes one or more spring-receiving surfaces and one or more spring clip-receiving surfaces.

In one embodiment, an assembled communication assembly can include: a module device having a first portion (e.g., middle portion) with a small cross-sectional profile and second portion (e.g., thick end portion) with a large cross-sectional profile, the first portion having a module top surface and opposite module bottom surface and module side surfaces and including optoelectronic components, the second portion having one or more optical fiber receptacles; a cage having a body defining a first open end having the first portion of the module device received therethrough with the second portion extending from the cage, the body defining a cage bottom surface associated with the module bottom surface and defining cage side surfaces associated with the module side surface and defining one or more lip-shaped first receiver members at a second end opposite of and extending toward the first end and at the top opening, the one or more lip-shaped first receiver members defining a cage top opening and having a first part of a fastening system; and a heat sink received into the cage so as to be thermally coupled with the first portion of the module device, the heat sink having a body defining a top surface with fin features and an opposite heat sink bottom surface that is engaged with the module top surface and the body having side surfaces that each define one or more slot-shaped second receiver members between the top surface fin features and the heat sink bottom surface and extending in a plane of the heat sink from a heat sink first end toward a heat sink second end, the heat sink first end being opposite or aligned with the cage first open end, the one or more slot-shaped second receiving members engaged with the one or more lip-shaped first receiver members, the one or more slot-shaped second receiver members having a second part of the fastening system fastened with the first part of the fastening system, wherein the cage and module device are dimensioned to frictionally engage with the heat sink and wherein one of the first or second part of the fastening system includes one or more springs and/or one or more spring clips and the other part includes one or more spring-receiving surfaces and/or one or more spring clip-receiving surfaces, which surfaces can be part of a continuous surface or a recess in the surface of the slot-shaped second receiver members.

In one embodiment, an assembled communication assembly can include: a module device having a first portion (e.g., middle portion) with a small cross-sectional profile and second portion (e.g., thick end portion) with a large cross-sectional profile, the first portion having a module top surface and opposite module bottom surface and module side surfaces and including optoelectronic components, the second portion having one or more optical fiber receptacles; a cage having a body defining a first open end having the first portion of the module device received therethrough with the second portion extending from the cage, the body defining a cage bottom surface associated with the module bottom surface and defining cage side surfaces associated with the module side surfaces and defining one or more lip-shaped first receiver members in a plane of the cage that start at a second end opposite of and extend toward the first end and at the top opening, the one or more lip-shaped first receiver members defining a cage top opening and having a first part of a fastening system; and a heat sink received into the cage so as to be thermally coupled with the first portion of the module device, the heat sink having a body defining a top surface with fin features and an opposite heat sink bottom surface that is engaged with the module top surface and the body having side surfaces that each define one or more slot-shaped second receiver members in a plane between the top surface fin features and the heat sink bottom surface and extending from a heat sink first end toward a heat sink second end, the heat sink first end being opposite or aligned with the cage first open end, the one or more slot-shaped second receiving members engaged with the one or more lip-shaped first receiver members, the one or more slot-shaped second receiver members having a second part of the fastening system fastened with the first part of the fastening system, wherein the cage and module device are dimensioned to frictionally engage with the heat sink and wherein the first part of the fastening system includes one or more springs and/or one or more spring clips and the second part includes one or more spring-receiving surfaces and/or one or more spring clip-receiving surfaces.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 1C shows an end of the assembled communication assembly of FIG. 1A;

FIG. 3 shows an embodiment of a heat sink having a slot-receiving member;

FIG. 4 shows an embodiment of a cage having a rail-receiving member, which rail-receiving member is adapted to slidably couple with the slot-receiving member of the heat sink of FIG. 3.

DETAILED DESCRIPTION

Figure 1A:
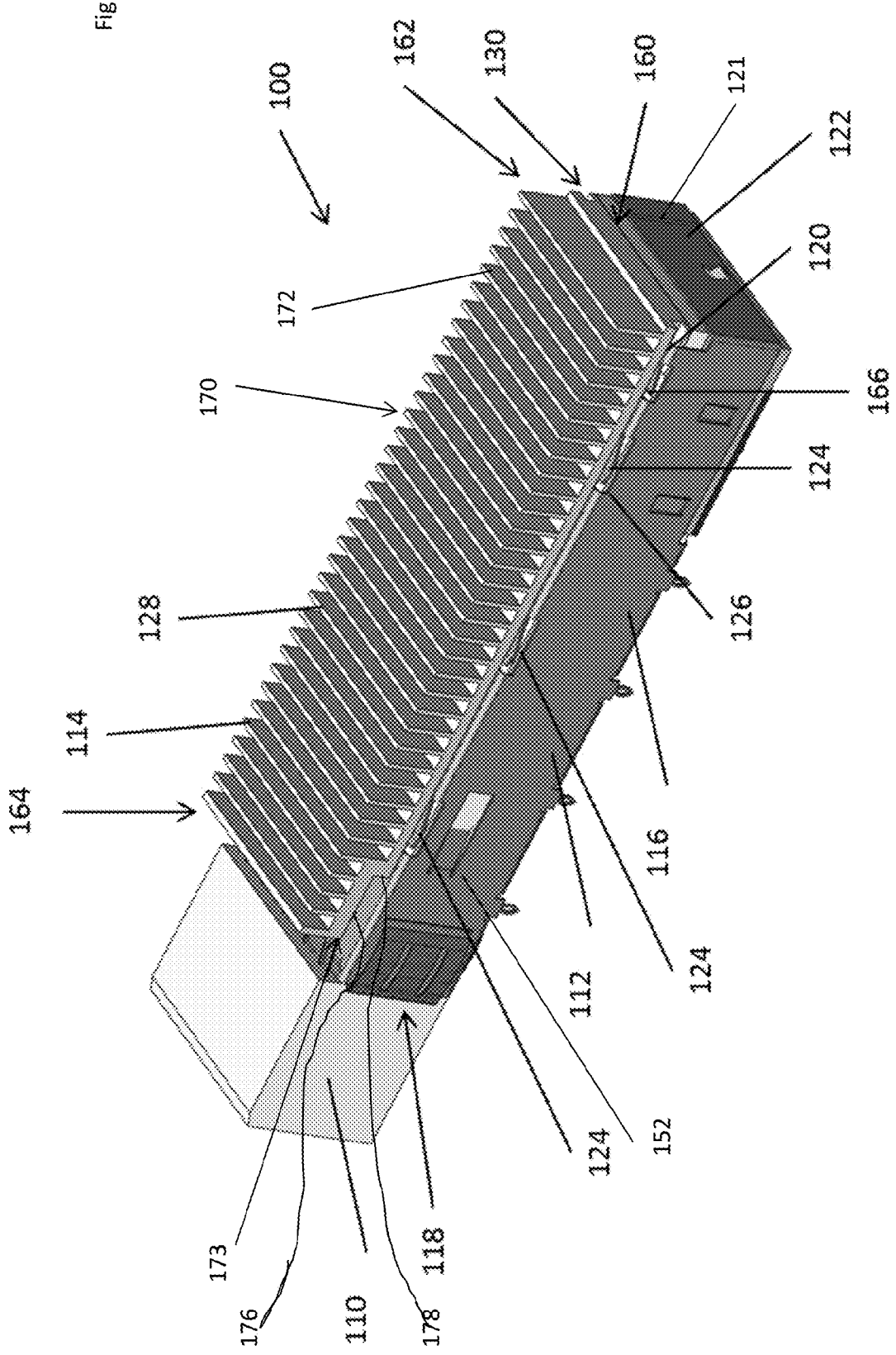
FIG. 1A shows an embodiment of an assembled communication assembly having a cage receiving a module and heat sink.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present invention relates to optical modules having heat sinks. The heat sink can be coupled with the module and module cage so as to dissipate heat in order to improve functionality and reliability of the optoelectronic components in the module. The optical module can be a form-factor module having dimensions, operability, or other parameters that comply with a form-factor agreement, such as those described herein which are incorporated by specific reference. The heat sink and module cage are cooperatively configured so that the heat sink slidably couples with the module cage without separate fastener components. That is, the heat sink and module cage are designed in order to be coupled together and stay coupled together by fastener features integrated with the heat sink and/or module cage. In one instance, the heat sink is configured with fastener features that couple with an ordinary module cage. In another instance, the heat sink and module cage are configured together to include corresponding fastener features that fasten together, such as rails and rail-receiving slots and springs. In some instances, the fastener features can be configured to slidably receive corresponding fastener features. In some instances, the corresponding fastener features can engage so as to lock the heat sink to the module cage, where such a lock can inhibit extraction of the heat sink from the module cage without first unlocking a lock component. As such, the heat sink and module cage can be adapted so that the heat sink is removably couplable with the module cage. Accordingly, the present invention eliminates the need to use separate fasteners, such as separate clips and screws, to couple a heat sink with a module cage by integrating fastener features in the module cage and/or heat sink. The integrated fastener features also increase the contact area between a module in the cage and a heat sink in order to improve heat dissipation from the module. The integrated fastener feature configuration can maximize the thermal surface contact by changing the mounting arrangement of the heat sink with respect to the module and/or module cage. Instead of a top-down mounting configuration, the present invention uses a cage that is adapted to slidably receive a portion of the heat sink therein so that the module contacts the heat sink and the cage retains a portion of the heat sink therein in contact with the module.

In one example illustrated here, the heat sink is inserted into the cage by sliding the heat sink over a guide from an end. The sliding insertion of the heat sink into the cage can be performed with the module already located in the cage or before the module is placed in the cage. The heat sink and module can be inserted into the cage by sliding the heat sink over the module so that corresponding heat transfer surfaces of the heat sink and module are contacted together. In another example illustrated herein, the heat sink is inserted into the cage by snapping the heat sink down into the cage, and then sliding the heat sink with respect to the cage to engage a fastening system. The sliding can also be via a guide surface. Instead of merely sliding from an end, the heat sink can be snapped down into the cage through a top opening and then slid over the cage until the heat sink engages fastener features of the cage. Once the heat sink and cage are engaged, the module and heat sink are in contact. These mounting configurations can maximize thermal surface contact between heat sink and transceiver module. The mounting configuration also eliminates any need for separate mounting clips and/or screws or other separate fasteners.

In one embodiment, the heat sink is inserted into the cage before the module. The coupling of the heat sink with the cage can be independent of the module. As such, the heat sink and cage can be coupled together independently of any other component associated with the cage.

In one embodiment, the heat sink and cage can each include continuous or partitioned receiving members of a receiving system (e.g., rail and slot) and include fasteners (e.g., spring and spring-receiving surface) of a fastening system. The continuous receiving members extend from a second end of the heat sink toward or all the way to an opposite first end or shelf surface of the heat sink and from a second end (e.g., opposite of the first open end) of the cage toward or all the way to an opposite first open end of the cage, and where upon engagement of the continuous receiving member at the first end of the heat sink is engaged with the continuous receiving member at the second end of the cage and the heat sink and cage are slid with respect to each other by sliding the receiving members until the first ends of the heat sink and cage are engaged. For example, at least one of the heat sink or cage can include a rail or rail guide, such as in a single rail being received into a grooved rail guide.

The partitioned or segmented receiving members are similar to the continuous receiving members except for the receiving member being partitioned or segmented into a plurality of discrete receiving members so that the heat sink can be snapped down into the cage by the cooperatively aligned, partitioned receiving members and gaps therebetween of the heat sink and cage providing for the snap-down function, which is followed by relative sliding of the heat sink and cage until the first ends are associated. In one option, the receiving members of both the heat sink and guide can be cooperatively segmented with gaps between the segments in order for segments of one component to be capable of being received through the gaps in the segments of the other component. Accordingly, the process of mounting the heat sink to the cage can be performed by placing the segments of the two components adjacent to the gaps of the segments of the other, snapping the segments past the gaps into a slidable position, and sliding at least one of the heat sink and cage with respect to the other to engage receiving members of the fastening system. During the top-snap mounting of the heat sink to the cage, the initial engagement of the segments of the receiving members can result in the heat sink and cage to be at relative intermediate positions with one end of the heat sink being extended further than the other than an end of the cage. The segments of the receiving members of the heat sink and cage can be applied together by placing the base of the heat sink into an open region in the top of the cage, and then the components can be coupled by a sliding motion to engage the fastening system. This configuration can be beneficial to offer a user mounting options when space constraints become a problem for mounting the heat sink from the very end of the cage.

In one embodiment, one of the heat sink or cage can include springs associated with the fastener features and/or receiving members, and the springs of one of the heat sink or cage can apply force against a surface of the other component. Additionally, a locking mechanism can be included on the cage that can engage with locking features of the heat sink in order to lock the heat sink to the cage. The locking mechanism can include a spring clip that clips into a receiving recess on the other component.

Figure 1B:
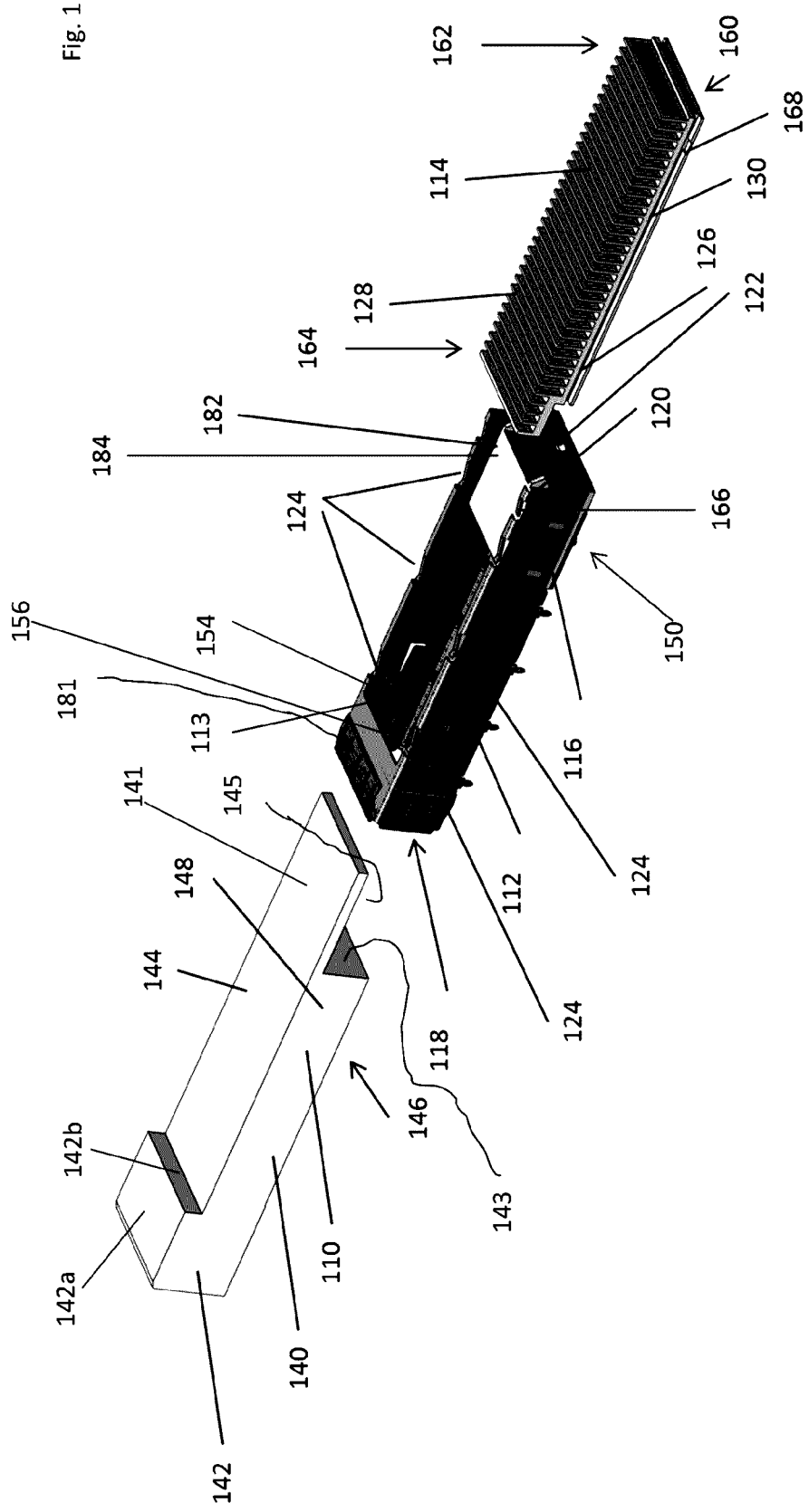
FIG. 1B shows the communication assembly of FIG. 1A disassembled.

FIGS. 1A-1C illustrate a communication assembly 100 having a module device 110, cage 112, and heat sink 114. The cage 112 includes a body 116 that defines a first open end 118 and an opposite second end 122 as well as a top opening 154 and internal cavity 113. The body 116 also includes a bottom wall 150 and side walls 152 that can define the first open end 118, second end 122, top opening 154, and internal cavity 113. The second end 122 is shown to be closed with an end wall 121. The body 116 can also include one or more first receiver members 120 that are configured as one or more rails 120a, which is shown to have one rail 120a on each side wall 152 in a plane of the cage 112. The one or more rails 120a can be a single rail or can be segmented rails as described herein. The rails 120a can also include first fastener members 124, which are illustrated as springs 124a. FIG. 1C shows a single rail 120a extending in a plane between the first open end 118 to the second end 122, with three springs 124a located at the rail 120a. While this rail is characterized as a continuous single rail 120a, the springs 124a have openings 127 therearound so that the springs 124a can function, which openings 127 divide the single rail 120a into rail portions. Each rail portion includes a spring 124a pointing toward the first open end 118. As shown, the springs 124a are leaf springs, which bend downward from the rail 120a, where the springs 124a have a free end 124b that is pointed toward the first open end 118 and away from the second end 122. A gap 123 can be located between the free end 124b and the next portion of the rail 120a. The rail 120a can also include a spring clip 166, which has a blunt free end 166a that acts as a locking mechanism to lock the heat sink 114 to the cage 112 once the free end 166a engages a spring clip recess 168 of the second receiver member 130 or slot 130a of the heat sink 114.

FIGS. 1A-1C also show the heat sink 114 to include a body 128 defining a top surface 170 with fin features 172 that are configured as cooling fins. The heat sink 114 includes a bottom surface 160 opposite of the top surface 170. The heat sink 114 includes a first end 164 that aligns with the first open end 118 of the cage 112 and a second end 162 that aligns with the second end of the cage 112. The heat sink 114 includes a shelf 173 at the first end 164, which shelf has a shelf side surface 178 and shelf bottom surface 176. The body 128 defines one or more second receiver members 130 that match and mate with the one or more first receiver members 120 of the cage 112. As shown, the second receiver members 130 of the heat sink 114 include slots 130a that correspond with the rails 120a of the cage 112.

FIGS. 1A-1C show the module device 110, cage 112, and heat sink 114 as separate components that can be provided as a kit and then assembled into the assembled communication assembly 100 of FIG. 1A. As shown, the module device 110 can include a middle portion 140, thin end portion 141, and thick end portion 142. A module top surface 144 extends over the middle portion 140 and thin end portion 141. A thick end portion 142 can include a top surface 142a and step surface 142b, which both can receive the corresponding shelf 173 surfaces. The thin end portion 141 and middle portion 140 can have a junction that includes the middle portion 140 having a shelf side surface 143 and the thin end portion 141 having a shelf bottom surface 145. The cage 112 is shown in FIG. 1A to include the side walls 152 and bottom wall 150 along with the rails 120a defining a top opening 154 shown in FIG. 1B that opens into an internal cavity 113 that is located between the side walls 152 and above the bottom wall 150 and between the first open end 118 and second end 122. The internal cavity 113 is adapted to receive the module device 110 therein once inserted through the first open end 118. The cage 112 also includes a component 182 located at the second end 122, where the component 182 includes a top surface 184 that fits into or under the shelf of the module device 110 so as to contact the shelf bottom surface 145 of the thin end portion 141. The component 182 can also include a side surface (not shown) that abuts or contacts the shelf side surface 143. The cage 112 also includes a top wall 156 at the first open end 118, which top wall 156 can include a host-engaging member 181. The top wall 156 can also engage the top surface 142a of the thick end portion 142. The shelf 173 of the heat sink 114 can be adapted to be received over and optionally contact the top wall 156 when assembled and optionally contact the top surface 142a, where the shelf bottom surface 176 can be adjacent to and/or contact the top wall 156 and/or top surface 142a and the shelf side surface 178 can abut against an edge of the top wall 156 and/or the step surface 142b. The second receiver members 130 can extend from the second end 162 to the shelf side surface 178. Correspondingly, the first receiver members 120 can extend from the second end 122 to the top wall 156. Also, the side walls 152 of the cage 112 may also include host-engaging members 181 at or adjacent to the first open end 118, which host-engaging members can be springs that press against a port in a host device. The assembly 100 is shown to include two rails 120a and two slots 130a, one on each side of the assembly, where both rails 120a are in the same rail plane on the cage 112 and both slots 130a are on the same slot plane of the heat sink 114.

FIGS. 1A-1C shows the second end 122 of the cage 112 with the thin end portion 141 of the module device 110 and the second end 162 of the heat sink 114 when the cage 112 receives the module device 110 and heat sink 114. It also shows the first receiver member 120 being a rail 120a that extends from the second end 122 toward the first open end 118 of the cage 112. The rail 120a is considered continuous even though the first fastener member 124 (e.g., springs 124a) and spring clip 166 are shown to be cut from the rail 120a with openings 127 around the first fastener members 124 and spring clips 166 and gaps 123. However, these gaps 123 are small such that the rail 120a is not considered to be segmented as described herein. These gaps 123 are not large enough for the heat sink 114 to be snap fit into the cage 112. On the other hand, the first receiver member 120 may be segmented and include segmented rails 506, such as those illustrated in FIG. 5 and described herein. The slot receiver member 130a on the heat sink 114 is shown to be continuous from the first end 164 to the second end 162, with optionally one or more spring recesses (not shown) adapted to be aligned with springs 124a when the assembly 100 is assembled and adapted to receive the springs 124a. In one aspect, the slot receiver member 130a can be continuous from first end 164 to one or more spring clip recesses 168 adapted to be aligned with the one or more spring clips 166. The spring clips 166 can include a free end 166a and an end that is coupled or integrated with the rail 120a.

The one or more first receiver members 120 of the cage 112 can have a first part 124 (e.g., first fastener) of a fastening system, and one or more second receiver members 130 of the heat sink 114 can have a second part (e.g., first fastener member) of the fastening system. The heat sink 114 can be adapted to be received into the cage 112 so as to be thermally coupled with the module device 110. The heat sink 114 can have a body 128 defining one or more second receiver members 130 configured to receive the one or more first receiver members 120. The one or more second receiver members 130 each can have the second part 126 of the fastening system, which second part can be a first fastener receiver surface, which can be a continuous surface or recess surface. The one or more second receiver members 130 can be slots with surfaces of the heat sink 114 that receive or otherwise engage the one or more first receiver members 120 that can be rails. The first fasteners can be springs that are received by surfaces of the slots 130a.

Additionally, the spring 124a is shown to be located in a spring opening 127 within the rail 120a. Going from the second end 122 to the first open end 118, the rail 120a includes: a rail member that transitions into a rail spring clip 166 that is bent downward from the rail spring clip member and surrounded by a spring clip opening; then a rail member that transitions into a rail spring 124a that is bent downward from the rail member and surrounded by a rail spring opening; and then additional rail members that each transition into a rail spring 124a that is bent downward from the rail member and surrounded by a spring opening 127. The length of the opening 127 or gap 123 can be less than the length of the spring 124a, or less than 50% of its length, less than 25% of its length, less than 15% of its length, or less than 10% of its length. The depth of the opening 127 can have similar related dimension compared to the downward position of the spring 124a. However, more than one rail member and spring clip can be included on the rail 120a. Also, only one rail member and rail spring can be used. However, the rail 120a and rail members are on the same plane from the second end 122 to its termination point adjacent to the first open end 118 or when it junctions with the top wall 156. The rail springs and rail spring clip point downward from the rail plane toward the bottom of the rail spring opening or rail spring clip opening, where the distance the rail springs or rail spring clips extend downwards from the rail plane is less than the distance across the slot 130a so that the spring 124a and spring clip 166 provide pressure against the inside walls of the receiver slot (e.g., surfaces 130b and 130d). The rail 120a can extend away from the cage wall 152 a distance that is equal to or less than the depth of the slot 130a so that the rail 120a may or may not contact the receiver slot surface 130c, where some contact friction between the rail 120a and slot surface 130c can be beneficial to retain the cage 112 coupled to the heat sink 114. However if the rail 120a extends too far, then it may bend the wall 152 when the cage 112 and heat sink 114 are coupled.

Figure 2A:
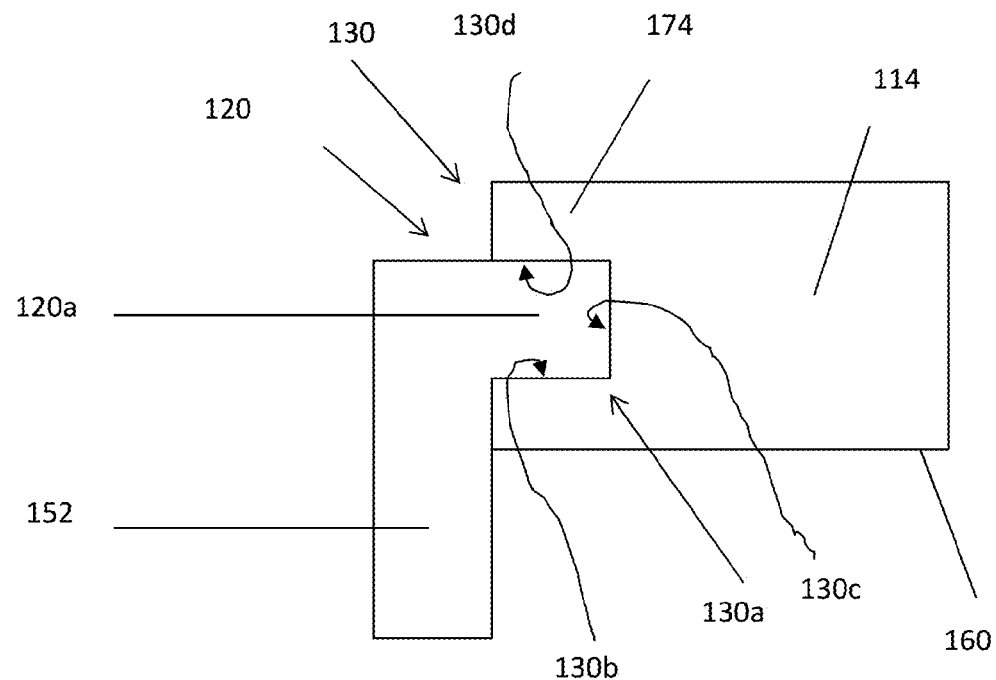
FIGS. 2A-2E show embodiments of rails and corresponding slots that receive the rails that can be used as receiving members for the cage and heat sink to be slidably coupled.
Figure 2B:
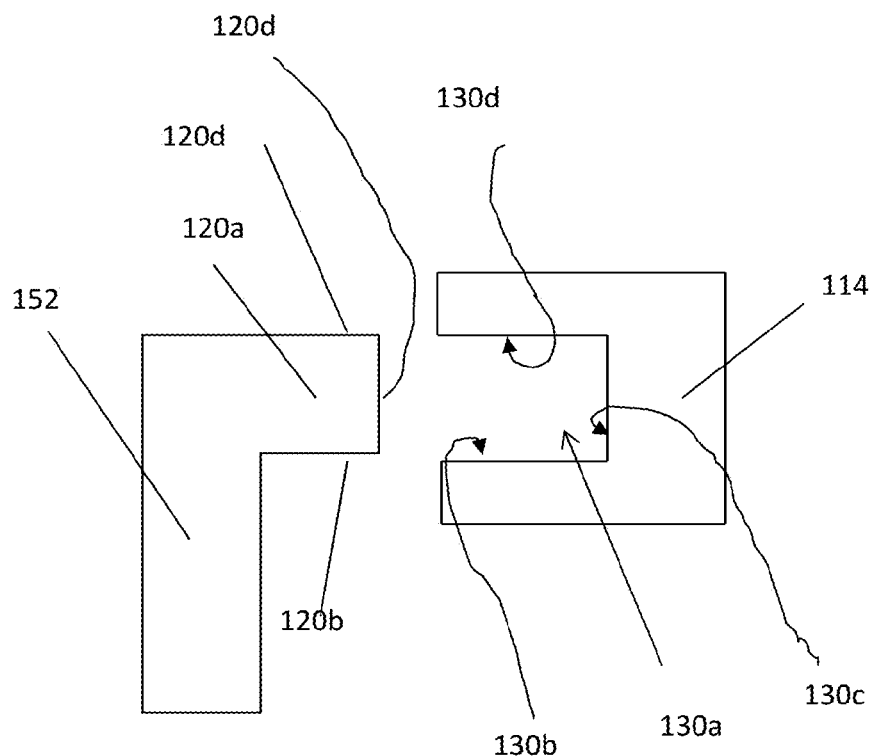

FIGS. 2A-2B illustrate an embodiment of the first receiver member 120 and the second receiver member 130, where the first receiver member 120 is a rail 120a and the second receiver member 130 is a slot 130a adapted to receive the rail 102a. The rail 120a is shown to extend from a side wall 152 of the cage. The slot 130a is shown to be part of the heat sink 114 (not shown to scale or configuration with fin features 172), which is shown generically. The rail 120a includes a bottom rail surface 120b, side rail surface 120c, and a top rail surface 120d. The slot 130a includes a bottom slot surface 130b, inside slot surface 130c, and a top slot surface 130d. As such, the rail 120a is configured to be received into the slot 130a with the bottom rail surface 120b adjacent and/or in contact with the bottom slot surface 130b, the side rail surface 120c adjacent and/or in contact with the inside slot surface 130c, and the top rail surface 120d adjacent and/or in contact with the top slot surface 130d.

Figure 2C:
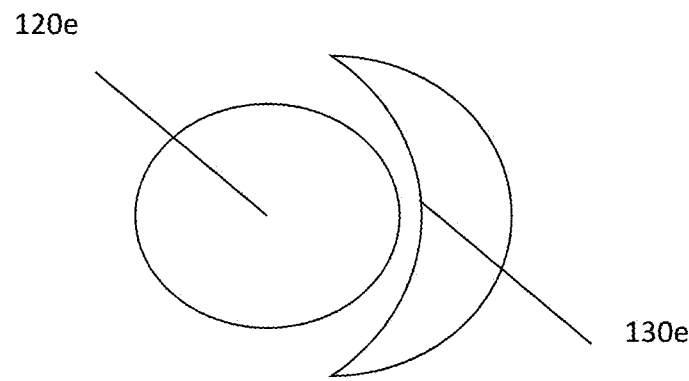
Figure 2D:
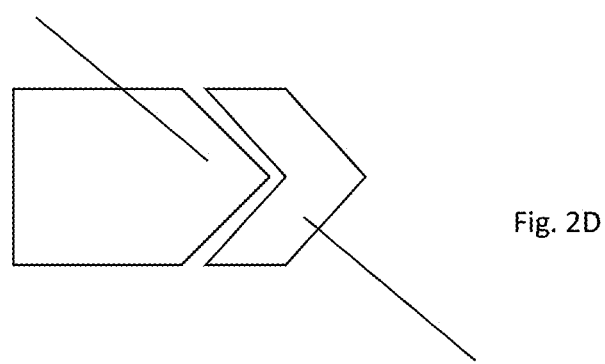
Figure 2E:
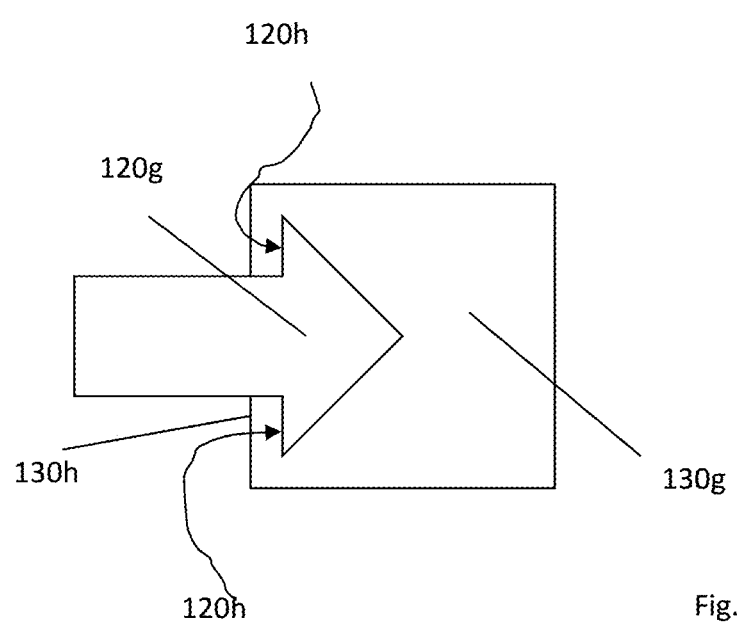

FIG. 2C shows an alternative embodiment of a first receiver member 120e that is rounded or has a circular cross-sectional profile and a corresponding rounded slot second receiver member 130e. FIG. 2D shows an alternative embodiment of a first receiver member 120f that has a tapered cross-sectional profile that fits into a "V" shaped slot second receiver member 130f. FIG. 2E shows an alternative embodiment of a first receiver member 120g that includes side extensions 120h that extend laterally from the main portion of the first receiver member 120g, and shows the correspondingly-shaped second receiver member 130g, where the side extensions 120h keep the first receiver member 120g from being pulled out from the second receiver member 130g as the second receiver member 130g also includes extensions 130h. However, each of these embodiments can be engaged and slid with respect to each other as described herein. Also, the illustrated slot section receiving members can extend further around and further encompass each of the first receiver members.

FIG. 3 shows the heat sink 114 separate from the cage 112. The first end 164 of the heat sink 114 shows the shelf 173 with the shelf side surface 178 and shelf bottom surface 176. Also, the second receiving member 130 is formed into a slot 130a or elongated recess that extends from the shelf 173 to the second end 162. The slot 130a is formed by one side having a wall that is formed by the bottom surface 160 and has surface 130b, and the other side having a wall that is formed by the heat sink body 128 to form surface 130d that opens to the side wall 174 with the fin features 172 extending therefrom. The rail surface 130c can be between the rail surfaces 130b, 130d, and has a distance that is about the same or less than the distance the springs 124a are bent downward from the plane of the rail 120a. This allows the rail 120a to fit in the slot 130a with the spring pressing the rail members against the slot surface 130d with the spring ends pressing against the slot surface 130b that is adjacent to the bottom surface 160. The slot surface 130b may have one or more recesses for receiving the springs 124a or spring clips 166, but may be otherwise smooth or continuous without recesses. As shown, only one recess 168 is proved as a spring clip recess 168. The slot 130a includes the surface 130b, which can be the second part 126 of the fastener system, where the surface 130b receives the first part 124 or first fastener when a spring 124a. The end 175 of the slot 130a adjacent to the shelf 173 can be tapered in order for the slot 130a to be slid relative to the rail 120a, which end 175 can be considered a leading end for engagement of the rails 120 and slot 130a.

FIG. 4 shows the cage 112 having the features described herein. Here, it can be seen that each rail 120a is divided into one rail member coupled to a spring clip and a few rail members and rail springs coupled thereto that extend substantially continuously from the second end 122 to the top wall 156. It can also be seen that the rails 120a can be formed by bending the cage side wall 152 inward toward the opening 154 and cavity 113, and the springs 124a can be formed by cutting the springs 124a from the rail 120a in order to form the opening 127. Also, the cage 112 is shown to include one or more side springs 180 on one or more cage side walls 152 that engage with the side surfaces 148 of the module device 110.

Figure 5:
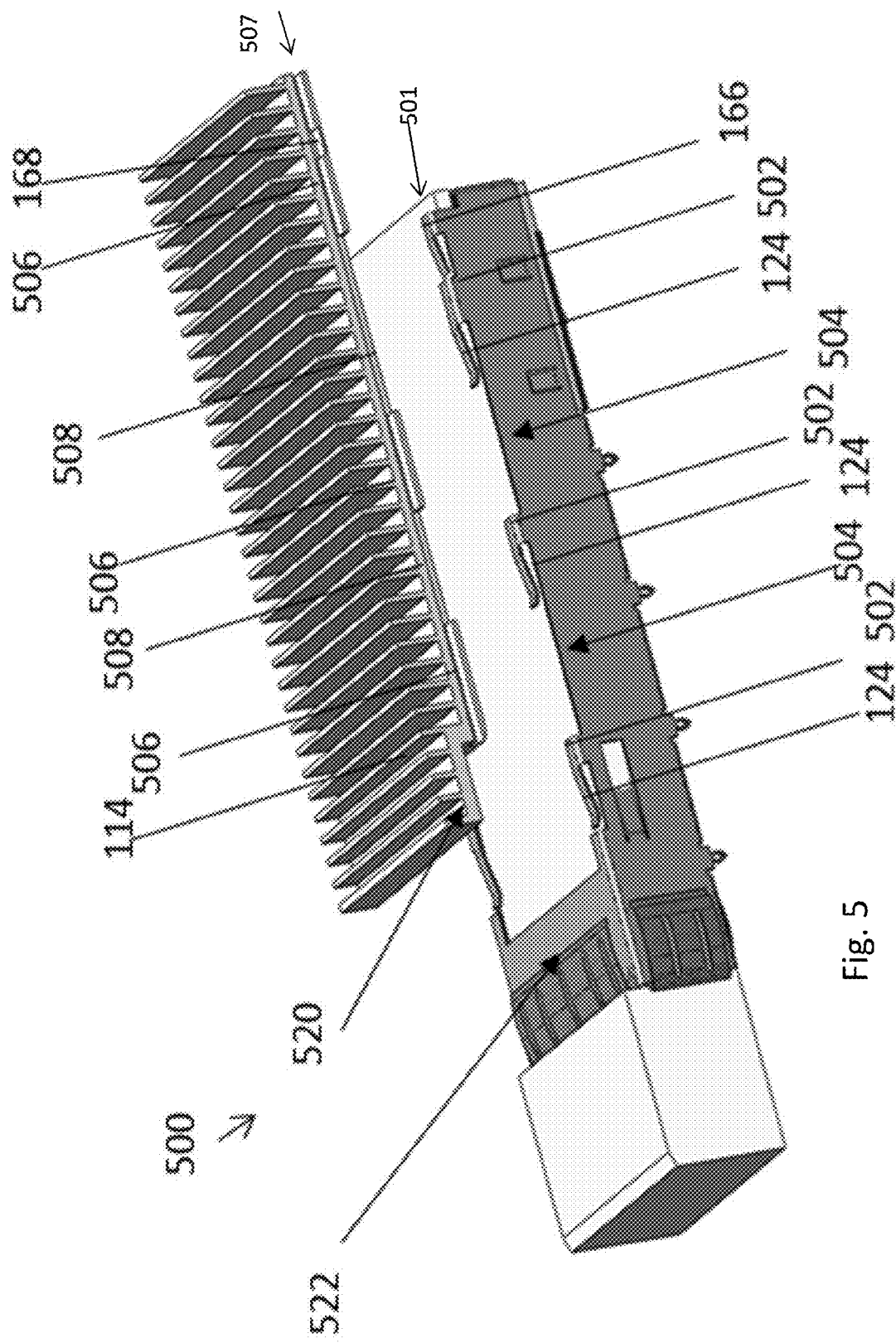
FIG. 5 shows an embodiment of a communication assembly having a cage with segmented rail-receiving members and a heat sink with segmented slot-receiving members, where the segments of the rail and slot can be snapped together.

FIG. 5 illustrates one embodiment of the present invention, which includes the cage 112 having a segmented rail guide 501 has a plurality of rail members 502 with springs 124a extending therefrom and having gaps 504 between each rail member 502. Here, it can be seen that the segmented rail guide 501 has the rail members 502 in a rail plane with large gaps 504 therebetween. The springs 124a can be the same as described herein. However, the gaps 504 are larger than the rail members 502, such as at least about 1.5 times or 2 times larger than the rail members 502. Also, the heat sink 114 can include a segmented slot 507 having slot member segments 506 and gaps 508 therebetween such that the segmented rail guide 501 fits with the segmented slot 507. Also, the slot member segments 506 have a dimension that is the same or less than the dimension of the gaps 504 so that the slot member segments 506 can fit therebetween, which allows the heat sink 114 to be snapped down into the cage 112 by the slot member segments 506 snapping down into the gaps 504 so that the rail member segments 506 can engage the rail members 502 and slide relative thereto for assembly. As shown, the segmented rail guide 501 fits into the gaps 508 of the segmented slot 507 between the slot member segments 506, and the slot member segments 506 fit into the gaps 504 of the segmented rail guide 501. Each rail member 502 of the segmented rail guide 501 can include the first part 124 (e.g., springs 124a) of the two-part fastening system.

Also, FIG. 5 shows that the dimension of one of the gaps 508 has a dimension that can receive the rail member 502, spring 124a, and spring clip 166 that are at the second end. The other gap 508 that is closer to the first end has a smaller dimension and is about the size or larger than the rail member 502 and spring 124a. In any event, the rail member 502 and corresponding spring 124a can fit into the gap 508 of the segmented slot 507.

The embodiment of FIG. 5 can be assembled by placing the rail member 502 into the gaps 508 of the segmented slot 507 such that the slot member segments 506 fit into the gaps 504 of the segmented rail guide 501. The cage 112 and heat sink 114 can then be slid relative to each other.

FIG. 5 also illustrates the cage 112 having a raised portion 522 and the heat sink 114 having a corresponding shelf 520 such that the raised portion 522 is received into the space of the shelf 520.

As illustrated and described herein the cage 112 can include the first receiver member 120 and first part 124 (e.g., spring) of the fastening system, while the heat sink 114 can include the second receiver member 130 and the second part 126 (e.g., spring-receiving surface of slot) of the fastening system. As shown and described herein, the first receiver member 120 can be a lip or rail 120a of the cage 112 that extends from the second end 122 toward the first end 118 of the cage 112. As shown and described herein, the second receiver member 130 can be a groove or slot 130a that extends from a heat sink first end 164 toward a heat sink second end 162. The slot 130a can include a first slot wall 130b and second slot wall 130d separated by a slot base 130c so that the slot 130a forms a recess adapted to receive the rail 120a. The rail 120a can be slidably received into the slot 130a. This configuration allows for the heat sink 114 to be slid into the cage 112 over the module device 110. This configuration may also be referred to as a tongue-in-groove arrangement, where the rail 120a is the tongue and the slot 130a is the groove. The first part 124 of the fastening system can be a spring 124a while the second part 126 can be a bottom slot surface 130b of the slot 130a, such as a flat or recessed surface of the slot 130a. The spring 124a presses against the surface 126 of the slot 130a so that the cooperation of the spring 124a and surface 126 of the slot 130a facilitates the fastening of the heat sink 114 to the cage 112. However, the features described in connection with the cage 112 can be implemented on the heat sink 114 with the corresponding features described in connection with the heat sink 114 can be implemented on the cage 112. That is, the heat sink 114 can include the rail and the cage can include the slot. Also, the heat sink 114 can include the spring while the cage 112 includes the spring-receiving surface. Also, the second part 126 of the fastening system can be similar to the first part 124, such that both the first part 124 and second part 126 are springs. Alternatively, the first part 124 and second part 126 can be surfaces that frictionally engage with each other. A locking member, such as the spring lock 124a described herein as a spring clip 166, can be used to fix the heat sink 114 to the cage 112 and module, especially when the slot 130a includes the first slot wall 130b having a recess such as the spring clip recesses 168 that correspond with the spring 124a when the cage 112 and heat sink 114 are in the operable position with respect to each other.

In addition to the foregoing embodiments, an assembly 100 can include a module device 110, a cage 112, and a heat sink 114. The cage 112 can have a body 116 defining a first open end 118 having the module device 110 received therethrough, and the body 116 can define one or more first receiver members 120 extending from a second end 122 opposite of the first open end 118. The one or more first receiver members 120 can have a first part 124 of a fastening system. The heat sink 114 can be slidably received into the cage 112 so as to be thermally coupled with the module device 110. The heat sink 114 can have a body 128 defining one or more second receiver members 130 mated with the one or more first receiver members 120. The one or more second receiver members 130 can have a second part 126 of the fastening system fastened or otherwise in contact with the first part 124 of the fastening system.

In one embodiment, an assembly 100 can include a module device 110 having a middle portion 140 with a medium cross-sectional profile, a thin end portion 141 with a small cross-sectional profile, and a thick end portion 142 with a large cross-sectional profile. The cage 112 can have a body 116 defining a first open end 118 having the middle portion 140 and thin end portion 141 of the module device 110 received therethrough into an internal cavity 113 of the cage 112 with the thick end portion 142 extending from the first open end 118 of the cage 112. The body 116 of the cage 112 can define one or more rail-shaped (e.g., lip-shaped or flange-shaped) first receiver members 120 extending from a second end 122 toward the first open end 118 in a plane. The one or more rail-shaped first receiver members 120 can have a first part 124 of a fastening system. The heat sink 114 can be slidably received into the cage 112 so as to be thermally coupled with the middle portion 140 of the module device 110. The heat sink 114 can have a body 128 defining one or more slot-shaped second receiver members 130 receiving the one or more rail-shaped first receiver members 120. The one or more slot-shaped second receiver members 130 having a second part 126 (e.g., surface of slot) of the fastening system fastened with the first part 124 of the fastening system. One of the first part 124 or second part 126 of the fastening system includes one or more springs (124*a*) and the other part includes one or more spring-receiving surfaces (126).

While the module device 110 is described to have a middle portion 140 smaller than a thick end portion 142, this is not necessary. The middle portion 140 and thick end portion 142 can be the same or different sizes, and even the thick end portion 142 may be smaller than the middle portion 140. The module device 110 can also include the thin end portion 141 shown that is opposite of the thick end portion 142, where the thin end portion 141 has a reduced profile so as to be capable of connecting to a connector. The thin end portion 141 can be adapted so as to form a shelf with respect to the middle portion 140 as shown, so that the thin end portion 141 can be received above a component 182 of the cage 112 that is located at the second end 122 of the cage 112. The thin end portion 141 fits over the component 182 and under the heat sink 114. As such, a heat sink-contacting surface 144 can extend from the thick end portion 142 and over the middle portion 140 and thin end portion 141.

In one embodiment, an assembly 100 can include a module device 110 having a middle portion 140 with a medium cross-sectional profile, a thin end portion 141 with a small cross-sectional profile, and a thick end portion 142 with a large cross-sectional profile. A module top surface 144 can extend over at least the middle portion 140 and thin end portion 141 (and optionally also over the thick end portion 142) and can be opposite of a module bottom surface 146 that extends under at least the middle portion 140 and thick end portion 142. The module 110 can include module side surfaces 148 extending over the middle portion 140, thin end portion 141, and thick end portion 142. A shelf side surface 143 can be bounding an end of the middle portion 140 opposite of the thick end portion 142. A shelf bottom surface 145 can be adjacent to the shelf side surface 143 and bounding a bottom of the thin end portion 141 opposite of the module top surface 144. A cage 112 having a body 116 can define a first open end 118 having the middle portion 140 of the module device 110 received therethrough with the thick end portion 142 extending from the first open end 118 of the cage 112. The body 116 of the cage can define a cage bottom wall 150 associated with the module bottom surface 146 and defining cage side walls 152 associated with the module side surfaces 148 and defining one or more rail-shaped first receiver members 120 that extend from a second end 122 opposite of and extending toward the first end 118 of the cage 112. The one or more rail-shaped first receiver members 120 can be at or define the shape of the top opening 154 in the cage 112. The one or more rail-shaped first receiver members 120 can define the cage top opening 154 and have a first part 124 of a fastening system. The heat sink 114 can be slidably received into the cage 112 so as to be thermally coupled with the middle portion 140 and thin end portion 141 of the module device 110. The heat sink 114 can have a body 128 defining a heat sink bottom surface 160 that is engaged with the module top surface 144. The body 128 can define one or more slot-shaped second receiver members 130 adjacent to the heat sink bottom surface 160 and extending from a heat sink second end 162 toward a heat sink first end 164. The one or more slot-shaped second receiving members 130 can be engaged with the one or more rail-shaped first receiver members 120. The one or more slot-shaped second receiver members 130 can have a second part 126 of the fastening system fastened or contacting the first part 124 of the fastening system. One of the first part 124 or second part 126 of the fastening system includes one or more springs 124 and one or more spring clips 166 and the other part includes one or more spring-receiving surfaces 126 and one or more spring clip-receiving surfaces 168.

In one embodiment, an assembly 100 can include: a module device 110 having optoelectronic components and the thick end portion 142 having one or more optical fiber receptacles (not shown). The thin end portion 141 can form a shelf with the middle portion 140 and include a portion of the module top surface 144 and module side surfaces 148. The cage 112 can have a body 116 defining a first open end 118 having the middle portion 140 of the module device 110 received therethrough with the thick end portion 142 extending from the cage 112. The body 116 can define a cage bottom wall 150 associated with the module bottom surface 146 and define cage side walls 152 associated with the module side surfaces 148 and define one or more rail-shaped first receiver members 120 that extend from a second end 122 opposite of and extending toward the first end 118 and at the top opening 154. The one or more lip-shaped first receiver members 120 can have a first part 124 of a fastening system. The heat sink 114 can be slidably received into the cage 112 so as to be thermally coupled with the middle portion 140 of the module device 110. The heat sink 114 can have a body 128 defining a top surface 170 with fin features 172 and an opposite heat sink bottom surface 160 that is engaged with the module top surface 144. The body 128 can have side surfaces 174 that each define one or more slot-shaped second receiver members 130 between to the top surface 170 and fin features 172 and the heat sink bottom surface 160. The one or more slot-shaped second receiver members 130 can extend from a heat sink second end 162 toward a heat sink first end 164. The heat sink first end 164 can be aligned with the cage first open end 118. The one or more slot-shaped second receiving members 130 can be engaged with the one or more rail-shaped first receiver members 120. The one or more slot-shaped second receiver members 130 can have a second part 126 of the fastening system fastened or in contact with the first part 124 of the fastening system. The cage 112 and module device 110 can be dimensioned to frictionally engage with the heat sink 114. One of the first part 124 or second part 126 of the fastening system includes one or more springs 124*a* and/or one or more spring clips 166 and the other part includes one or more spring-receiving surfaces 126 and/or one or more spring clip-receiving surfaces 168.

In any one of the embodiments of the assembly 100 described herein, the module device 110 can include a transceiver, transmitter, receiver, or other optical communication component. The module 110 can be any optical communication device.

In one embodiment, the cage 112 can be configured to inhibit radiation. In one aspect, the cage 112 can include one or more side springs 180 on one or more cage side walls 152 that engage with the side surfaces 148 of the module device 110. In one aspect, the cage 112 can include an end wall 121 at the second end 122. In one aspect, the cage 112 can include one or more host device couplers 181 that couple with a port of a host device (not shown). The host device couplers 181 can be springs that press against an inside surface of the port of a host device in order to couple the assembly 100 to the host device.

In one embodiment, the cage 112 can also receive a connection module 182 that is configured to communicatively couple with the module device 100 and a host device such that the host device is capable of communicating with the module device 100. For example, the connection module 182 can be dimensioned to receive the shelf of the module 110, which can include receiving and/or mating with the shelf side surface 143 and shelf bottom surface 145. The connection module 182 can be located at a second end 122 opposite of the first open end 118, and can be configured to communicatively couple with the module device 110 and a host device such that the host device is capable of communicating with the module device 110. The connection module 182 can have a module top surface 184 that can be thermally coupled with thin end portion 141 of the module 110 so as to be thermally coupled therethrough to the heat sink 114. The connection module top surface 184 along with the one or more lip-shaped first receiver members 120 and module top surface 144 cooperate to friction-fit or otherwise frictionally engage with the one or more slot-shaped second receiver members 130 of the heat sink 114. The friction fit with thermal coupling of the module top surface 184 to the heat sink 114 may be through the thin end portion 141 of the module device 110.

In one embodiment, the cage bottom wall 150 can have one or more openings (not shown) between the cage side walls 152. Also, the cage bottom wall 150 can be optional, or fragmented with gaps between bottom members.

In one embodiment, the one or more first receiver members 120 of the cage 112 can be configured as rails that extend from the cage side walls 152. For example, the cage 112 can include two rail-shaped first receiver members 120 that are directed toward each other from two cage side walls 152. That is, the two rail-shaped first receiver members 120 extend from side walls 152, not end walls or the bottom wall 150, and are located at the top of the side walls 152 opposite of the bottom wall 150. In another example, the two cage side walls 152 can have top ends 152a that are curved inwardly toward each other so as to form the rail-shaped first receiver members 120. The rail-shaped first receiver members 120 can be oriented at an angle from about 45 degrees acute or obtuse to about 90 degrees with respect to cage side walls 152. While only a 90-degree orientation is shown, other angles are possible. The rail-shaped first receiver members 120 can include a top surface and a bottom surface, which both engage the slot-shaped second receiver members 130, such as by the top surface contacting the wall 130d and the bottom surface contacting the wall 130b.

In one embodiment, the rail-shaped first receiver members 120 can include the first part 124 (e.g., spring) of the fastening system oriented and/or extending toward the cage bottom wall 150. Also, the rail-shaped first receiver members 120 can include the first part 124 of the fastening system oriented and/or extending substantially parallel or aligned with the cage side walls 152. In one aspect, the rail-shaped first receiver members 120 can be integrated with the first part 124 (e.g., springs) of the fastening system. In one aspect, the rail-shaped first receiver members 120 can have openings 127 around the first part 124 of the fastening system, such that the first part 124 of the fastening system is accessible from outside of the cage 112. Also, the second part 126 of the fastening system can be accessible from outside of the cage 112 via the openings 127 around the first part 124 of the fastening system.

In one embodiment, the first part 124 of the fastening system can include one or more springs. The springs can be coil springs, tension/extension springs, compression springs, torsion springs, flat springs, cantilever springs, volute springs, balance springs, leaf springs, v-springs, or the like. Cantilever springs are illustrated in the figures.

The second part 126 of the fastening system can include one or more surfaces configured for receiving the springs. For example, a surface (e.g. bottom slot surface 130b) that extends along the slot of the second receiver member 130 can be used for all of the surfaces to receive the springs. The second part 126 of the fastening system can include a recessed spring surface (e.g., 168) for each spring. While only flat surfaces are shown, a recess 168 can be positioned to receive a spring. The recesses 168 can be smooth, rounded, or have hard corner transitions. The clip recess 168 can also be used for spring recesses.

In one example, the first part 124 of the fastening system can include one or more springs for each rail-shaped first receiver member and the second part 126 can include a single, uniform spring surface for all of the springs of a single rail-shaped first receiver member. In another example, the first part 124 of the fastening system can include three or more springs, one on each rail-shaped first receiver member of the rail. In another example, the first part 124 of the fastening system can include one or more springs for each rail-shaped first receiver member that each frictionally engage with a bottom slot surface 130b of the slot-shaped second receiver member 130, the bottom slot surface 130b being the second part 126 of the fastening system.

In one embodiment, the first part 124 of the fastening system includes one or more spring clips 166 and the second part 126 includes a spring clip-receiving surface 168 for each spring clip 166. The spring clips 166 can be configured similarly to the springs 124a. However, the springs 124a can include a ramped free end 124b as illustrated while the spring clips 166 can include a blunted free end 166a as illustrated. The spring clips 166 can be configured as cantilever springs that point downward, while the cantilever springs 124a have a downward-pointing portion 124c that transitions to an upward-pointing ramp free end 124b. The spring-receiving surface 126 being a recess 168 may also determine whether a cantilever spring is a spring 124a or a spring clip 166. Also, if the spring-receiving surface 126 is blunted or configured to inhibit the spring clip 168 from releasing, then the spring may be a spring clip 166. As shown, the springs 124a are different from the spring clips 166.

In one example, the first part 124 of the fastening system can include one or more spring clips 166 and the second part 126 can include a recessed spring clip-receiving surface 168 for each spring clip 166. The recess spring clip-receiving surfaces 168 can have a blunt side wall on the first end side 164 thereof, which can prevent the heat sink 114 from sliding further into the cage 112. As such, the spring clip 166 can function as a position lock, and once engaged with the recess spring clip-receiving surfaces 168, the spring clip 166 can fix or otherwise lock the position of the heat sink 114 relative to the cage 112.

In one embodiment, the cage also includes or receives a connection module that is configured to communicatively couple with the module device and a host device such that the host device is capable of communicating with the module device. The connection module located at a second end of the cage opposite of the first open end, and can be configured to communicatively couple with the module device and a host device such that the host device is capable of communicating with the module device. The connection module can have a top surface thermally coupled with a bottom surface of the heat sink, such as a bottom shelf surface. In one aspect, the connection module has a top surface that along with the one or more lip-shaped first receiver members and module top surface cooperate to frictionally engage with the one or more slot-shaped second receiver members and bottom surface of the heat sink.

In one embodiment, the cage bottom has one or more openings that extend between the cage side surfaces. That is, the cage bottom wall does not have to be fully enclosed, and can be open to allow access to the bottom of the module. This can allow for heat to dissipate from the bottom of the module through the openings in the cage bottom wall.

In one example, the cage has two rail-shaped first receiver members that are directed toward each other from two cage side walls. That is, each side wall includes at least one rail-shaped first receiver member, which is oriented so as to point toward each other. The two cage side walls can have top ends that are curved inwardly toward each other so as to form the rail-shaped first receiver members protruding from the side walls. That is, a portion of each side wall of the cage can be bent from normal to an angle up to or past 90 degrees such that the bent portion forms a rail. The lip-shaped first receiver members can be oriented at an angle from about 45 degrees acute or obtuse to about 90 degrees with respect to cage side walls.

In one embodiment, the first and second receiver members are segmented with corresponding gaps between the segments to allow for interlacing. That is, the rails can be separated with gaps between the segments and the slots can be segmented with gaps between the segments. The rail segments can be dimensioned to be smaller than the slot gaps, and the rail gaps can be dimensioned to be larger than the slot segments. As such, the first and second receiver members can be segmented with corresponding gaps between the segments. However, the cage can include the slots and the heat sink can include the rails. As such, the heat sink can include segmented rails or segmented grooved rail guides and the cage includes the other of the segmented rails or segmented grooved rail guide. Thus, the rail can be received into the grooved rail guide to couple the cage to the heat sink.

The heat sink can be made of any material used for optical device heat sinks known or developed. The heat sink can be prepared from a material with a high thermal conductivity so as to be able to conduct heat from the module device. The heat sink can be prepared from aluminum, copper, diamond, synthetic diamond, composite materials, copper-tungsten, silicon carbide in aluminum matrix, dymalloy (e.g., diamond in copper-silver alloy matrix), or alloy thereof or combination thereof.

In one embodiment, the present invention includes a method of manufacturing the assembly of any one of the embodiments described herein. One feature of the method of manufacture is that the module device can be slid into the cage from one end, and then the heat sink can be slid into the cage from the other end. When fully slid into the cage, the fastening system can engage to lock the heat sink to the cage so as to be thermally coupled with the module device. The heat sink can be withdrawn from the cage by disengaging the fastening system, and then slid from the cage. The heat sink can be frictionally engaged with the cage and/or module device.

The method of manufacture of an assembled assembly can generally include: providing the module device, cage, and heat sink; inserting the module device into the first open end of the cage; and inserting the heat sink into the cage such that the module device and heat sink are thermally coupled and the first part and second part of the fastening system engage. The method can also include preparing the module device, cage, and/or heat sink. When the receiver members include continuous rails and grooves that extend from one end toward the other end, ends of the cage and heat sink can be engaged so as to engage the rails and grooves and the cage and heat sink can be slid with respect to each other. The heat sink and cage can be slid with respect to each other until an end is reached. For example, the rails and/or grooves can have a termination point or end that inhibits further sliding, and the rail can be slid in the groove until reaching the termination point. The rails or walls that define the grooves can have a ramp that facilitates engagement thereof where the ramp is narrower at an end that engages and then increases to the regular thickness of the rails or groove walls.

In one embodiment, when the cage and heat sink have segmented rails and groove members, the method of assembly can be altered from end-to-end engagement and sliding to a downward snap of the heat sink into the cage and then sliding until assembled. The segmented rails and grooves include gaps between the segments that have larger dimensions than the segments so that the segments fit between the gaps. This allows the segments of the gaps and rails to at least partially pass each other before engaging and allowing for the sliding function to occur. For example, the bottom wall of a groove can be segmented and the segmented bottom wall can be passed through gaps between segments of the rail until the rail is within the groove and capable of being slid. The top wall of the groove can be un-segmented so that the segments of the rail can contact the top wall to provide a barrier and to align the segmented rails in the segmented groove, and thereby the continuous top wall of the groove can provide a guide for snapping the heat sink into the cage and sliding the heat sink with respect to the cage until assembled. This assembly process can include placing the segments of the segmented rail guide into the gaps of the segmented rail such that the segmented rail fits into the gaps of the segmented rail guide. Further, the assembly process can include snapping the heat sink into the cage, and sliding the heat sink with respect to the cage to engage the fastening system.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally-equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims. All references recited herein are incorporated herein by specific reference in their entirety.

The invention claimed is:

1. An assembly comprising:
   a cage having a cage body defining a first open end and an open top, the cage body having one or more rails on each side of the open top between the first open end and a second end wall of the cage body, a cage cavity having the first open end and the open top;
   a module device located in the cage cavity so as to protrude from the first open end; and
   a heat sink slidably received and located in the cage cavity over and thermally coupled with the module device so as to protrude from the open top, the heat sink having a heat sink body defining one or more slots on each side that slidably receive and mate with the one or more rails of the cage,
   wherein one of the rails or the slots includes one or more leaf springs and another of the rails or the slots includes one or more leaf spring-receiving surfaces.

2. An assembly comprising:
   a cage having a cage body defining a first open end and an open top, the cage body having a rail on each side of the open top extending from a second end of the cage body toward the first open end, a cage cavity having the first open end and the open top;
   a module device located in the cage cavity so as to protrude from the first open end; and
   a heat sink slidably received into the second end and located in the cage cavity over and thermally coupled with the module device so as to protrude from the open top, the heat sink having a heat sink body defining slots on each side that slidably receive and mate with the rails of the cage, wherein one of the rails or the slots includes one or more leaf springs and another of the rails or the slots includes one or more leaf spring-receiving surfaces.

3. An assembly comprising:

a cage having a cage body defining a first open end and an open top, the cage body having a plurality of rails on each side of the open top between the first open end and a second end wall of the cage body, a cage cavity having the first open end and the open top, the plurality of rails on each side of the open top have a rail gap between each of the rails;

a module device located in the cage cavity so as to protrude from the first open end; and a heat sink slidably received and located in the cage cavity over and thermally coupled with the module device so as to protrude from the open top, the heat sink having a heat sink body defining a plurality of slots on each side that slidably receive and mate with the plurality of rails of the cage, the plurality of slots on each side of the heat sink body have a slot gap between each of the slots, wherein one of the rails or the slots includes one or more leaf springs and another of the rails or the slots includes one or more leaf spring-receiving surfaces.

* * * * *

UNITED STATES PATENT AND TRADEMARK OFFICE
CERTIFICATE OF CORRECTION

PATENT NO. : 9,545,033 B2
APPLICATION NO. : 14/733894
DATED : January 10, 2017
INVENTOR(S) : Long Van Nguyen Page 1 of 1

It is certified that error appears in the above-identified patent and that said Letters Patent is hereby corrected as shown below:

In the Specification

In Column 2, Line 14, delete "of fastening system" and insert -- "of a fastening system" --, therefor.

In Column 6, Line 39, delete "between heat sink" and insert -- "between the heat sink" --, therefor.

In Column 7, Line 22, delete "than an", therefor.

In Column 9, Line 1, delete "shows" and insert -- "show" --, therefor.

In Column 9, Line 56, delete "a spring opening" and insert -- "a rail spring opening" --, therefor.

In Column 9, Line 61, delete "dimension" and insert -- "dimensions" --, therefor.

In Column 11, Line 10, delete "when a spring" and insert -- "with a spring" --, therefor.

In Column 11, Line 30, delete "guide 501" and insert -- "guide 501. Rail guide 501" --, therefor.

In Column 12, Line 32, delete "with the" and insert -- "and the" --, therefor.

In Column 14, Line 50, delete "between to the top" and insert -- , "between the top" --, therefor.

In Column 14, Line 50, delete "between to the" and insert -- , "between the" --, therefor.

Signed and Sealed this
Fifteenth Day of January, 2019

Andrei Iancu
*Director of the United States Patent and Trademark Office*